United States Patent [19]

McDonough

[11] Patent Number: 5,802,188

[45] Date of Patent: Sep. 1, 1998

[54] INTEGRATED CHASSIS AND RESONANCE COMPONENT IN AN ELECTRONIC DEVICE

[75] Inventor: William J. McDonough, McMinnville, Oreg.

[73] Assignee: Hewlett-Packard Company, Palo Alto, Calif.

[21] Appl. No.: 900,045

[22] Filed: Jul. 24, 1997

Related U.S. Application Data

[63] Continuation of Ser. No. 442,552, May 16, 1995, abandoned.

[51] Int. Cl.$^6$ .................................................. H04R 25/00
[52] U.S. Cl. ........................ 381/159; 381/160; 381/205
[58] Field of Search ............................... 381/159, 160, 381/205, 154; 181/182, 199

[56] References Cited

U.S. PATENT DOCUMENTS

| | | | |
|---|---|---|---|
| 5,097,513 | 3/1992 | Jordan et al. | 381/159 |
| 5,524,062 | 6/1996 | Oh | 381/159 |

FOREIGN PATENT DOCUMENTS

| | | | | |
|---|---|---|---|---|
| 0546211 | 12/1991 | European Pat. Off. | ......... | H05K 7/14 |

OTHER PUBLICATIONS

Robert Cole, "Fast Fabrication With Foam Chassis", Machine Design, Mar. 9, 1995, pp. 115–120.

*Primary Examiner*—Sinh Tran

[57] ABSTRACT

An electronic device includes an electronic component and a chassis to support the electronic component. The electronic device also includes a non-supporting chassis component that is integrally formed along with and as part of the chassis. The non-supporting chassis component is functionally operable in cooperation with the electronic component to enhance performance of the electronic component. In one example, the electronic component is an electronic speaker and the non-supporting chassis component is a resonance chamber positioned adjacent to the speaker to improve the speaker's sound qualities. The chassis and non-supporting chassis component (i.e., the resonance chamber) are integrally formed together via a single injection molding process using expanded polypropylene.

3 Claims, 3 Drawing Sheets

INTEGRATED CHASSIS AND RESONANCE COMPONENT IN AN ELECTRONIC DEVICE

CROSS REFERENCE TO RELATED APPLICATION

This is a continuation of application Ser. No. 08/442,552 filed on May 16,1995, now abandoned.

TECHNICAL FIELD

This invention relates to an electronic device having a chassis with an integrated component. More particularly, this invention relates to a molded E-PAC (electronic packaging assembly concept) chassis having an integrated resonance chamber formed therein for use in cooperation with an electronic speaker provided in the electronic device.

BACKGROUND OF THE INVENTION

A chassis for an electronic device typically includes a plastic or metal framework mounted within an external housing. The chassis framework consists of many individual pieces that are formed of metal or plastic. For a metal chassis, metal sheets are stamped or bent to a desired shape and then treated using a galvanizing process. For plastic pieces, the frame parts are injection molded into the appropriate shape. The frame pieces are then assembled using screws, bolts, welding, rivets, glue, or other fastening techniques to form the chassis. Once the chassis is assembled, various electronic components that make up the electronic device are mounted to it.

The overall assembly process is time-consuming. One reason is that there are a fairly large number of parts, counting the chassis—which includes individual frame pieces, screws, nuts, bolts, washers, spacers, etc.—and the electronic components themselves. Another reason is that the assembly process requires time-involved assembly of the chassis, followed by the assembly of each component to the chassis. The process is not conducive to automation, but instead is practically limited to hand or manual assembly. Apart from assembly, there is an additional review time to ensure that each component is properly and securely fastened to the chassis. If a component is improperly mounted, excessive vibration might result, potentially damaging the component and those around it. The prolonged assembly time drives up costs, as does the number of individual assembly parts.

Consider, for example, the presumably easy task of assembling a speaker within an electronic device. Such speakers are employed in electronic devices as alarms, beepers, and vocal or other audio playback mechanisms. Once the framework is assembled, the speaker (or a circuit board which carries it) is oriented and positioned at a preset location within the framework. The speaker is attached to the chassis framework via multiple screws or small bolts. Since the speakers in electronic devices are often small (especially, portable devices), a resonance chamber is typically used in conjunction with the speaker to improve the speaker performance. The resonance chamber is positioned over the speaker and has one or more exit openings situated away from the speaker. The speaker emits audio sound waves into the resonance chamber where they resonate before escaping through the exit openings. The resonance chamber causes an increased sound pressure and an improved response in a wider range of frequencies, which generally improves the sound qualities of the speaker.

During assembly, the resonance chamber is placed over and encloses a sound emitting port of the speaker. A sealing glue or the like is applied at an interface boundary between the chamber and speaker (or its circuit board) to form an airtight seal. The seal prevents air from leaking out of the chamber to ensure that the sound waves leave through the exit opening. As can be appreciated, the assembly of a common speaker and resonant chamber is time consuming and involves many individual parts.

To eliminate the number of parts associated with conventional metal or plastic frames, a new packaging process known as E-PAC (electronic packaging assembly concept) has recently been pioneered and introduced in some products by Hewlett-Packard Company. E-PAC is a technique where the electronic components are first placed in a protective frame-like foam material, and then the foam material is inserted into the housing. The foam material is a "bumper grade" expanded polypropylene (EPP) which is molded into form-fitting pieces that hold the electronic components.

The general use of E-PAC as a chassis for an electronic device is described in a European Patent Application EP 0 546 211 A1. The E-PAC chassis replaces the conventional metal framework. The European Application defines a two piece chassis used to hold electronic components in a common computer workstation. The use of E-PAC as a chassis is a significant advance because it eliminates many component parts while still providing a secure, vibration and noise reducing framework within which components are mounted. The E-PAC significantly reduces assembly time and enables automated assembly.

Prior to this invention, the E-PAC chassis has been used as a packaging framework to support the various electronics. This invention concerns an improved chassis, and preferably an E-PAC chassis, that integrates functional mechanical components that play a non-supporting role with the fundamental packaging framework.

SUMMARY OF THE INVENTION

An electronic device includes an electronic component and a chassis to support the electronic component. In an example embodiment, the electronic component is a speaker. The electronic device also includes a non-supporting chassis component that is integrally formed along with and as part of the chassis. The non-supporting chassis component is functionally operable in cooperation with the electronic component to enhance performance of the electronic component. In the example embodiment, the non-supporting chassis component is a resonance chamber positioned adjacent to the speaker.

Preferably, the chassis and resonance chamber are integrally formed together via a single injection molding process using expanded polypropylene. The resonance chamber is implemented as an elongated tube extending along a longitudinal axis from a proximal end positioned adjacent to the speaker to a distal end. A partial shielding wall is also provided which continues from the distal end of the tube along the longitudinal axis to shield an opening in the tube's distal end from blockage or occlusion, such as by a ribbon cable.

By integrating the supporting chassis and non-supporting mechanical component, the electronic device of this invention significantly reduces the number of parts and assembly time, thereby reducing overall manufacturing costs.

BRIEF DESCRIPTION OF THE DRAWINGS

In FIG. 1, the exemplary illustrated chassis is configured for supporting electronic components employed in a heart defibrillator system.

DETAILED DESCRIPTION OF THE PREFERRED EMBODIMENT

Figure 1:
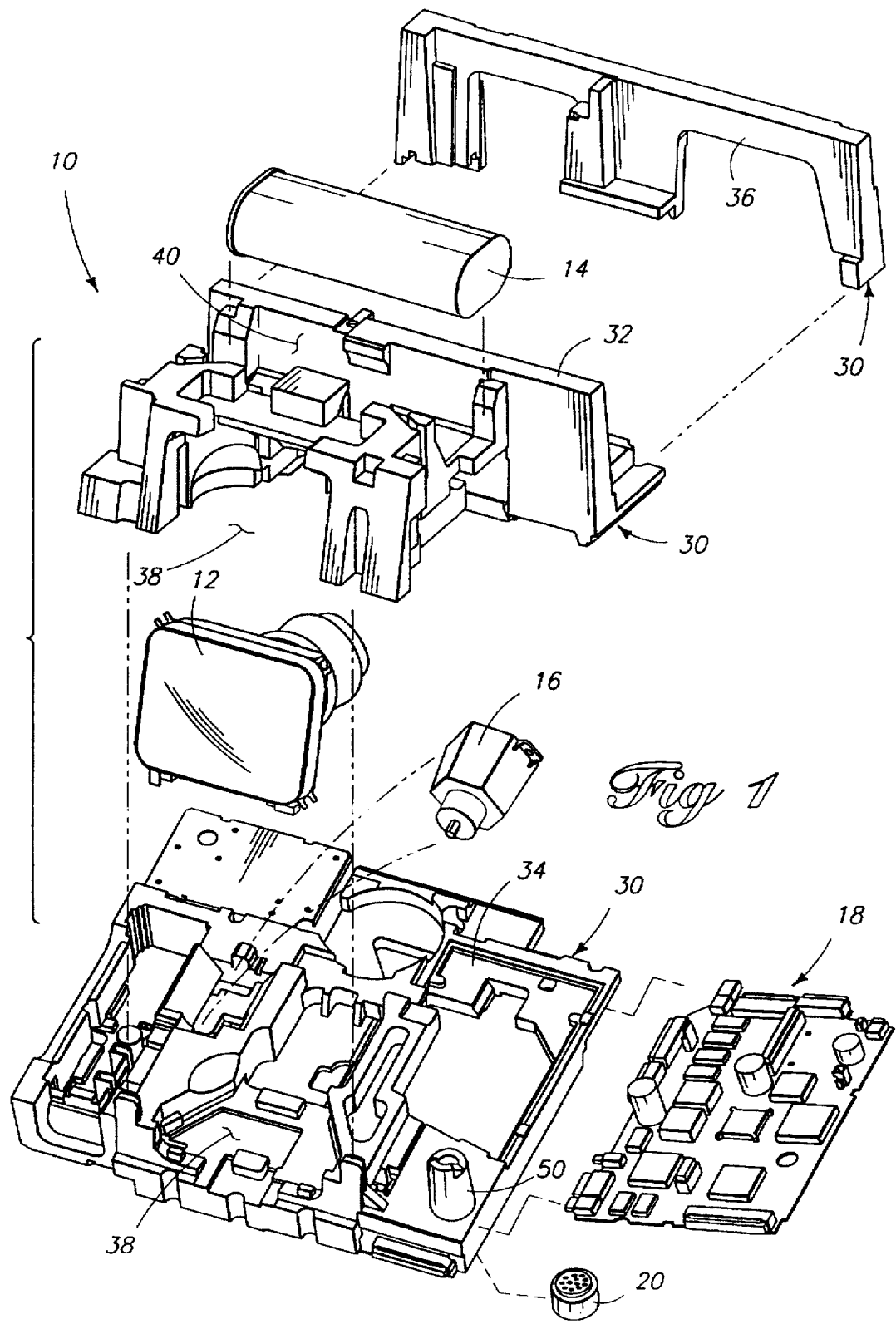
FIG. 1 is an exploded isometric view of a chassis for an electronic device according to the preferred embodiment of this invention.

FIG. 1 shows an electronic device 10 constructed according to the preferred embodiment of this invention. For purposes of discussion, electronic device 10 is shown in an exemplary implementation as a heart defibrillator system. The primary electronic components of the defibrillator system are a CRT display monitor 12, a capacitor 14, and a relay 16. The defibrillator system also includes a control circuit board 18 and an electronic sound emitting device or speaker 20. The operation of the defibrillator system and the function of these components are conventional and are not described in detail in this disclosure.

Electronic device 10 has a chassis 30 which holds the electronic components within an external housing (not shown). Chassis 30 has three members: a first or upper member 32, a second or lower member 34, and a third or rear member 36. The three chassis members form a frame unit having form-fitting recesses configured to receive and hold associated electronic components. For instance, chassis 30 includes a monitor cavity or recess 38 which is formed partly in upper member 32 and partly in lower member 34 to hold monitor 12 and a capacitor recess 40 formed in upper member 32 to support capacitor 14.

Most all of chassis 30 functions as a supporting frame unit to securely hold the components in a predefined, space-saving, three-dimensional arrangement. According to this invention, however, a portion of chassis 30 is used as a functional mechanical structure that does not perform a frame-like support function. In this illustrated embodiment, chassis 30 includes a non-supporting chassis component 50 that is integrally formed along with and as part of the frame unit. This particular chassis component 50 serves as a resonance chamber for electronic speaker 20. In this manner, the chassis component functions in cooperation with an electronic component, such as electronic speaker 20, to enhance performance of that electronic component.

Figure 2:
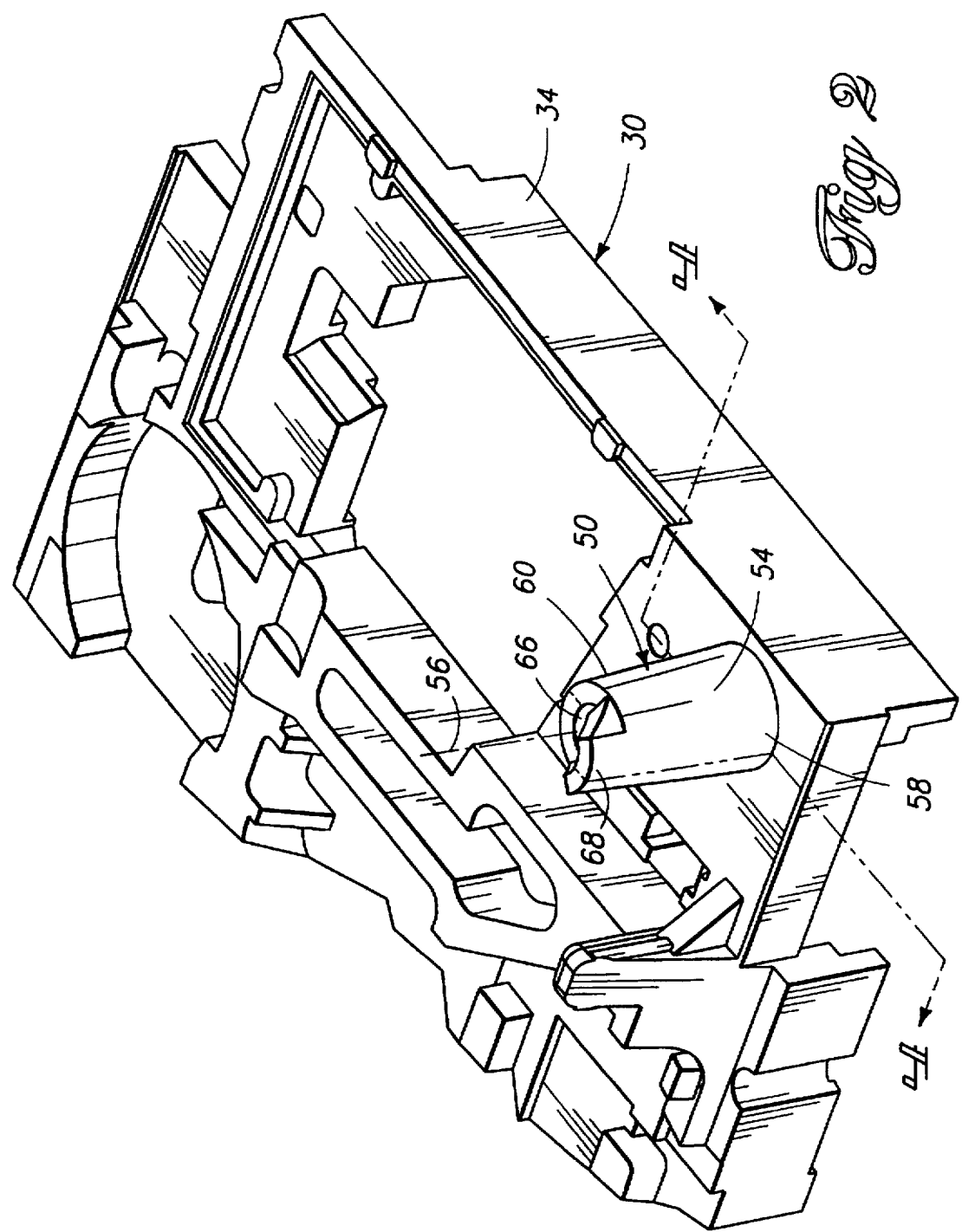
FIG. 2 is a top isometric view of a portion of the chassis of FIG. 1, and shows a resonance chamber according to this preferred embodiment of invention.
Figure 3:
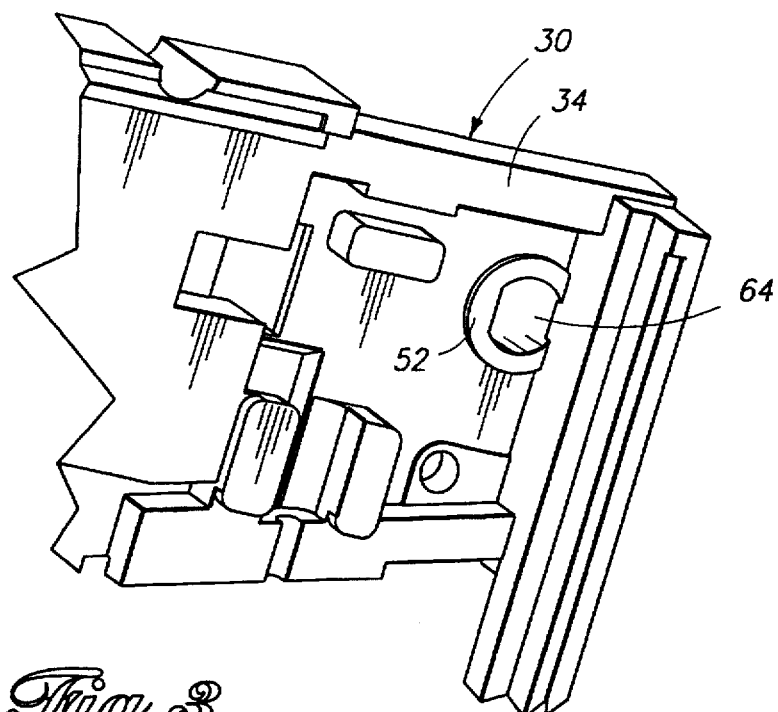
FIG. 3 is a bottom isometric view of the chassis portion of FIG. 2.
Figure 4:
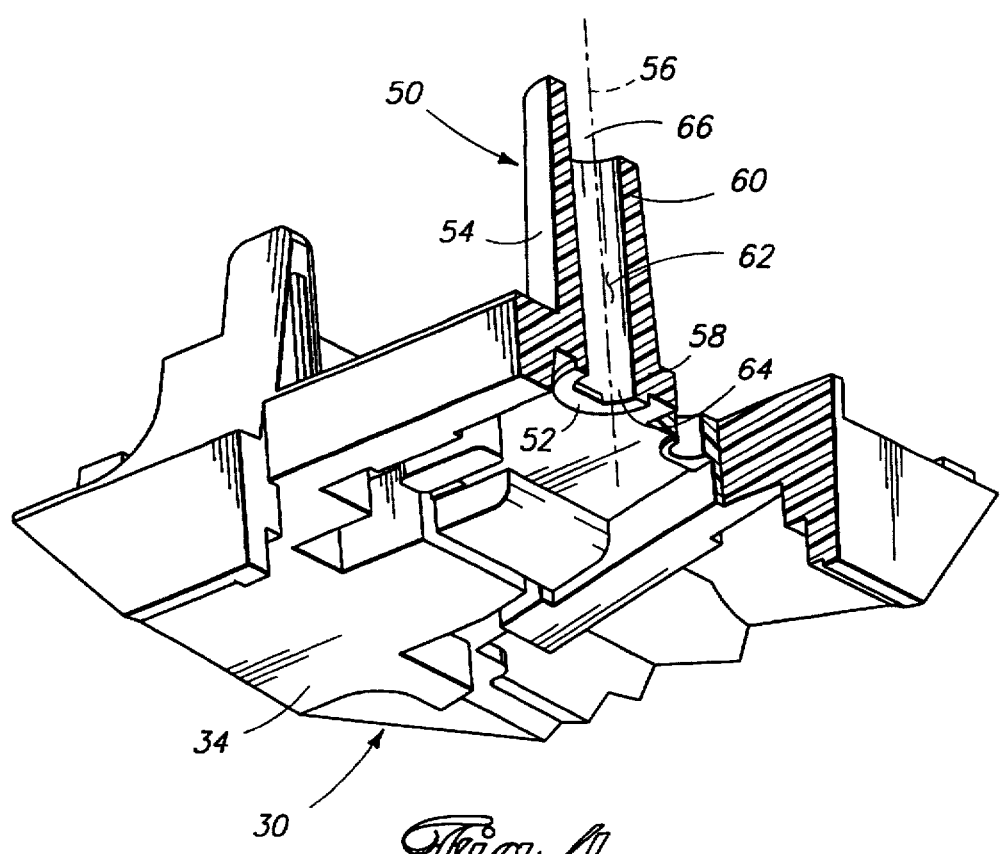
FIG. 4 is a sectional view of the resonance chamber taken through line 4—4 of FIG. 2.

FIGS. 2-4 show non-supporting chassis component 50 in more detail. With reference to FIGS. 3 and 4, chassis 30 includes an annular speaker mounting rim 52 formed on the underside of lower chassis member 34 to receive and hold the electronic speaker (not shown). As shown in FIGS. 2 and 4, resonance chamber 50 comprises an elongated tube 54 which extends along a longitudinal axis 56 from a first or proximal end 58 positioned adjacent to the electronic speaker (when mounted in rim 52) to a second or distal end 60. Tube 54 is hollow and forms a substantially cylindrical cavity 62 which is contiguous from a first or proximal opening 64 at proximal end 58 to a second or distal opening 66 at distal end 60.

Speaker mounting rim 52 is provided at the periphery of, and about, proximal opening 64 of tubular resonance chamber 50. When mounted, the speaker is tightly held by the form-fitting mounting rim 52 to provide an annular air seal between the speaker and resonance chamber 50. The chassis is formed of a plastic material, and preferably expanded polypropylene, which has high-dimensional stability, and yet is resilient to form fittingly hold the speaker. The chassis material is described below in more detail.

In the illustrated embodiment, resonance chamber 50 has a partial shielding wall 68 (FIG. 2) which continues along axis 56 from distal end 60 of tube 54. Shielding wall 68 is preferably provided on one side of distal opening 66 and partly encircles axis 56 for somewhere between about one-quarter (90°) to one-half (180°) of the full cylindrical tube body. For proper operation of resonance chamber 50, the chamber's air escape opening 66 should not be occluded. Shielding wall 68 helps prevent any possible occlusion to distal opening 66. For example, shielding wall 68 prevents opening 66 from being blocked or covered by a ribbon cable.

The operation of a speaker in conjunction with a resonance chamber is well understood. It is well known that an appropriate resonance chamber can be configured adjacent to a speaker to obtain an increased sound pressure, an improved response in wider range of frequencies, or a softened sound output. In an example resonator, known as the "Helmholz" resonator, the following design criteria is invoked:

$$fv = \frac{CD}{4} \sqrt{\frac{1}{\pi V(L+0.75D)}}$$

where fv is the resonant frequency [Hz], V is the volume of the resonance chamber within cavity 62 [mm$^2$], D is the diameter of distal opening 66 [mm], L is the distance from the speaker to distal opening 66 [mm], and C is the speed of sound, or approximately 344,000 mm/sec. Accordingly, by adjusting the volume of the chamber, and the depth and size of opening 66, a desired resonant frequency for resonance chamber 50 can be obtained. It is noted that the "Helmholz" resonator is provided for example purposes, and other conventional resonator designs may be used.

Integrated chassis 30, including the frame unit and non-supporting resonance chamber, is preferably integrally formed as an E-PAC (electronic packaging assembly concept) chassis that is produced from "bumper grade" expanded polypropylene (EPP). Preferably, a single-shot injection molding process is used to produce each chassis member. More specifically, an EPP-based chassis is produced by first defining a form having a first part that provides a shape of a supporting frame unit that is configured to support an electronic device, such as a speaker, and a second part that provides a shape of a non-supporting chassis component, such as the resonance chamber. Once the mold is defined, the next step is to create foamed up polypropylene granules according to a known method to produce polypropylene beads. The granules contain carbon which ensures that the final plastic material has an electric conductivity sufficient to avoid electrostatic charging of the chassis. Next, the polypropylene beads are blown with a pressure of about 4 bar into the desired two-part form of the integrated frame/resonance chamber chassis to simultaneously mold the frame unit and resonance chamber. This pressurized introduction of the beads leads to a volume reduction.

In a subsequent step, vacuum is applied to the form to increase the volume of the polypropylene material, causing the beads to assume the shape of the form. Next, hot water vapor of about 180° C. is blown in, causing coalescence of the beads at their surfaces (i.e., cross-linkage). After that, the form is opened and the integral foam part is removed. Finally, the part is tempered.

The process for forming an electronics supporting chassis is described in more detail in European Patent Application EP 0 546 211 A1, which is assigned to Hewlett-Packard Company.

Expanded polypropylene has several advantageous properties which make it suitable as a plastic material for a chassis design of this invention. For example, expanded polypropylene has high-dimensional stability, and yet is resilient and energy absorbent. This ensures a shock-absorbing mounting of the electronic components in the chassis. For instance, the custom molded rim 52 for speaker 20 provides shock and vibration absorption around the electronically delicate speaker.

The deformability or resilience of the plastic material can be influenced by the density of the material. In an example chassis, the density of the polypropylene is in a range of about 60 to 80 grams/liter which provides both dimensional stability and a good shock-absorbing effect. A broader density range of 25–80 grams/liter may also be used for certain applications. By varying the density, the hardness and shock-absorbing characteristics of the expanded polypropylene can be adjusted to the specific application. As density decreases, the material becomes softer, resulting in a better shock-absorbing quality. Another advantage of polypropylene is its temperature stability which is important when the components carried by the chassis generate a large amount of heat. Another advantage of polypropylene is that it can be completely recycled.

Although most preferred, expanded polypropylene is not the only possible plastic material having advantageous properties which make it suitable for use as a chassis according to this invention. Other plastic materials with dimensional stability and a certain resilience can also be used as the chassis material. The plastic materials ought to be moldable to form the chassis shape and contour. Alternative materials are polyurethane or polyethylene, although these materials are not quite as satisfactory as polypropylene in all respects.

The chassis of this invention has many benefits. One benefit is that the invention significantly reduces the number of parts by integrating a supporting chassis and a non-supporting mechanical component. Another benefit is that an integrated chassis, with support frame and component formed together as one unit, significantly reduces assembly time. Another benefit is that the integrated chassis design reduces the overall manufacturing costs.

In compliance with the statute, the invention has been described in language more or less specific as to structure and method features. It is to be understood, however, that the invention is not limited to the specific features described, since the means herein disclosed comprise exemplary forms of putting the invention into effect. The invention is, therefore, claimed in any of its forms or modifications within the proper scope of the appended claims appropriately interpreted in accordance with the doctrine of equivalents and other applicable judicial doctrines.

I claim:

1. An electronic device comprising:
   an external housing;
   an electronic speaker;
   an internal chassis to support the electronic speaker, the chassis being mounted within the housing;
   a non-supporting chassis component integrally formed along with and as part of the chassis to define a resonance chamber, the resonance chamber having an elongated tube extending along a longitudinal axis from a proximal end positioned adjacent to the speaker to a distal end and a partial shielding wall continuing from the distal end of the tube along the longitudinal axis to shield an opening at the distal end of the tube from occlusion; and
   wherein the chassis and non-supporting chassis component are integrally formed of expanded polypropylene.

2. A chassis for an electronic device having an electronic speaker, the chassis forming an internal frame structure for the electronic device and is housed within an external housing, the chassis comprising;
   a frame unit to support the electronic speaker in a position that allows sound to be emitted from a front of the speaker; and
   a non-supporting component integrally formed along with and as part of the frame unit to define a resonance chamber, the resonance chamber having an elongated tube extending along a longitudinal axis from a proximal end juxtaposed to the front of the speaker to a distal end and a partial shielding wall continuing from the distal end of the tube along the longitudinal axis to shield an opening at the distal end of the tube from occlusion; and
   wherein the frame unit and non-supporting component are integrally formed of expanded polypropylene.

3. A resonance chamber for use with an electronic speaker in an electronic device, the electronic device having a chassis formed of expanded polypropylene with a form-fitting support sized to receive and hold the electronic speaker, the resonance chamber comprising:
   a tube integrally formed of expanded polypropylene together with the chassis of the electronic device, the tube extending along a longitudinal axis from a proximal end adjacent to the form-fitting support in the chassis to a distal end; and
   a partial shielding wall continuing from the distal end of the tube, along the longitudinal axis to shield an opening at the distal end of the tube from occlusion.

* * * * *